(12) United States Patent
Noda et al.

(10) Patent No.: US 11,349,037 B2
(45) Date of Patent: May 31, 2022

(54) INDIUM PHOSPHIDE WAFER, PHOTOELECTRIC CONVERSION ELEMENT, AND METHOD FOR PRODUCING A MONOCRYSTALLINE INDIUM PHOSPHIDE

(71) Applicant: JX NIPPON MINING & METALS CORPORATION, Tokyo (JP)

(72) Inventors: Akira Noda, Kitaibaraki (JP); Masaru Ota, Kitaibaraki (JP); Ryuichi Hirano, Tokyo (JP)

(73) Assignee: JX NIPPON MINING & METALS CORPORATION, Tokyo (JP)

( * ) Notice: Subject to any disclaimer, the term of this patent is extended or adjusted under 35 U.S.C. 154(b) by 0 days.

(21) Appl. No.: 14/780,333

(22) PCT Filed: Mar. 11, 2014

(86) PCT No.: PCT/JP2014/056229
§ 371 (c)(1),
(2) Date: Sep. 25, 2015

(87) PCT Pub. No.: WO2014/156596
PCT Pub. Date: Oct. 2, 2014

(65) Prior Publication Data
US 2016/0043248 A1    Feb. 11, 2016

(30) Foreign Application Priority Data

Mar. 26, 2013  (JP) .............................. JP2013-063145

(51) Int. Cl.
*H01L 31/0304* (2006.01)
*H01L 31/18* (2006.01)
(Continued)

(52) U.S. Cl.
CPC ........ *H01L 31/03042* (2013.01); *C30B 15/04* (2013.01); *C30B 15/20* (2013.01);
(Continued)

(58) Field of Classification Search
CPC .... C30B 15/04; C30B 27/02; H01L 31/03042
See application file for complete search history.

(56) References Cited

U.S. PATENT DOCUMENTS

| 4,591,654 A | 5/1986 | Yamaguchi et al. |
| 4,645,560 A | 2/1987 | Matsumoto et al. |

(Continued)

FOREIGN PATENT DOCUMENTS

| CN | 101230488 A | 7/2008 |
| CN | 102187020 A | 9/2011 |

(Continued)

OTHER PUBLICATIONS

Hirano et al., "Reduction of Dislocation Densities in InP Single Crystals by the LEC Method Using Thermal Baffles", 1996, Journal of Electronic Materials, vol. 25, All Pages.*

(Continued)

*Primary Examiner* — Daniel P Malley, Jr.
(74) *Attorney, Agent, or Firm* — Birch, Stewart, Kolasch & Birch, LLP (57) ABSTRACT

In this photoelectric conversion element wherein group III-IV compound semiconductor single crystals containing zinc as an impurity are used as a substrate, the substrate is increased in size without lowering conversion efficiency. A heat-resistant crucible is filled with raw material and a sealant, and the raw material and sealant are heated, thereby melting the raw material into a melt, softening the encapsulant, and covering the melt from the top with the encapsulant. The temperature inside the crucible is controlled such that the temperature of the top of the encapsulant relative to (Continued)

the bottom of the encapsulant becomes higher in a range that not equal or exceed the temperature of bottom of the encapsulant, and seed crystal is dipped in the melt and pulled upward with respect to the melt, thereby growing single crystals from the seed crystal. Thus, a large compound semiconductor wafer that is at least two inches in diameter and has a low dislocation density of 5,000 cm$^{-2}$ can be obtained, despite having a low average zinc concentration of $5\times10^{17}$ cm$^{-3}$ to $3\times10^{18}$ cm$^{-3}$, at which a crystal hardening effect does not manifest.

6 Claims, 1 Drawing Sheet

(51) Int. Cl.
| | |
|---|---|
| *C30B 15/22* | (2006.01) |
| *C30B 27/02* | (2006.01) |
| *C30B 29/42* | (2006.01) |
| *H01L 31/0735* | (2012.01) |
| *C30B 15/20* | (2006.01) |
| *C30B 29/40* | (2006.01) |
| *C30B 15/04* | (2006.01) |
| *C30B 15/30* | (2006.01) |

(52) U.S. Cl.
CPC ............ *C30B 15/203* (2013.01); *C30B 15/22* (2013.01); *C30B 15/30* (2013.01); *C30B 27/02* (2013.01); *C30B 29/40* (2013.01); *C30B 29/42* (2013.01); *H01L 31/0735* (2013.01); *H01L 31/184* (2013.01); *Y02E 10/544* (2013.01); *Y02P 70/50* (2015.11)

(56) References Cited

U.S. PATENT DOCUMENTS

| | | | | |
|---|---|---|---|---|
| 4,738,934 | A * | 4/1988 | Johnston, Jr. | ....... H01L 21/3245 257/E21.326 |
| 4,863,554 | A | 9/1989 | Kawasaki et al. | |
| 4,911,780 | A * | 3/1990 | Morioka | ................. C30B 15/02 117/18 |
| 5,935,321 | A | 8/1999 | Chiou et al. | |
| 6,325,849 | B1 | 12/2001 | Hideo et al. | |
| 6,589,447 | B1 | 7/2003 | Ishizaki et al. | |
| 7,442,355 | B2 | 10/2008 | Kawase | |
| 7,700,423 | B2 | 4/2010 | Cooke et al. | |
| 8,068,526 | B2 * | 11/2011 | Makino | .............. G02B 6/12007 372/43.01 |
| 2002/0139296 | A1 * | 10/2002 | Ohnishi | ................. C30B 29/48 117/81 |
| 2006/0096526 | A1 | 5/2006 | Cho et al. | |
| 2007/0079751 | A1 * | 4/2007 | Matsumoto | ............. C30B 11/00 117/89 |
| 2007/0101924 | A1 | 5/2007 | Kawase et al. | |
| 2008/0023725 | A1 | 1/2008 | Cooke et al. | |
| 2009/0072205 | A1 * | 3/2009 | Kawase | .................. C30B 29/40 252/521.5 |
| 2010/0189154 | A1 | 7/2010 | Makino et al. | |
| 2011/0126889 | A1 | 6/2011 | Bourke, Jr. et al. | |
| 2011/0193196 | A1 | 8/2011 | Okita | |
| 2012/0112135 | A1 | 5/2012 | Sakurada et al. | |
| 2013/0291788 | A1 | 11/2013 | Houzvicka et al. | |

FOREIGN PATENT DOCUMENTS

| | | | |
|---|---|---|---|
| EP | 0251458 | A2 | 1/1988 |
| JP | 2-192722 | A | 7/1990 |
| JP | 2-233588 | A | 9/1990 |
| JP | 02233588 | A * | 9/1990 |
| JP | 4-280447 | A | 10/1992 |
| JP | 6-227898 | A | 8/1994 |
| JP | 9-165292 | A | 6/1997 |
| JP | 10-152400 | A | 6/1998 |
| JP | 2000-86398 | A | 3/2000 |
| JP | 2003-206200 | A | 7/2003 |
| JP | 2004-345888 | A | 12/2004 |
| JP | 2005-47797 | A | 2/2005 |
| JP | 2006-232574 | A | 9/2006 |
| JP | 2008-60554 | A | 3/2008 |
| JP | 2008-120614 | A | 5/2008 |
| JP | 2010-30868 | A | 2/2010 |
| JP | 2010-157691 | A | 7/2010 |
| JP | 4830312 | B2 | 12/2011 |
| TW | 200830367 | A | 7/2008 |
| TW | 201133903 | A1 | 10/2011 |
| TW | 201301378 | A1 | 1/2013 |
| WO | WO 00/65642 | A1 | 11/2000 |
| WO | WO 2004/106597 | A1 | 12/2004 |
| WO | WO 2005/007939 | A1 | 1/2005 |

OTHER PUBLICATIONS

English machine translation of Kohiro et al. (JP H 02233588 A) provided by the EPO website. 2021. All Pages. (Year: 2021).*
Japan Manufacturers' Society of Compound Semiconductor Materials (JAMS-CS), "EPD measurements for low dislocation density GaAs and InP substrates", III-Vs Review, vol. 12, No. 6, 1999, All Pages. (Year: 1999).*
Clemans et al., "BULK III-V Compound Semi-Conductor Crystal Growth," AT&T Technical Journal, vol. 68, No. 1, Jan./Feb. 1989, XP000103192, pp. 29-42.
Extended European Search Report, dated Dec. 6, 2016, for European Application No. 14773825.6.
Hirano et al., "Reduction of Dislocation Densities in InP Single Crystals by the LEC Method Using Thermal Baffles," Journal of Electronic Materials, vol. 25, No. 3, Mar. 1, 1996, pp. 347-351.
International Search Report, dated Jun. 17, 2014, issued in PCT/JP2014/056229.
Hosokawa et al., "Development of 3-inch Diameter InP with Low Dislocation Density Using the VCZ Method," 1992, pp. 85-88 (3 pages total), with English abstract.
Oda et al., "Recent Developments in InP Bulk Materials," Chapter 4, Recent Development of Bulk Crystal Growth, Research Signpost, 1998, pp. 97-125 (32 pages total).
European Office Action for European Application No. 14773825.6, dated Jun. 9, 2020.
Fang et al., "Growth and Properties of InP Single Crystals," Journal of Crystal Growth, vol. 66, 1984, pp. 327-332.
MTI Corporation, "LEC Method (Liquid Encapsulated Czochralsku)", https://www.mtixtl.com/xtlflyers/LEC.doc, 2011, 1 page.
European Patent Office Communication and extended search report issued in the European Patent Application No. 20217266.4 dated Mar. 23, 2021.
U.S. Advisory Action, dated Feb. 1, 2021 for U.S. Appl. No. 15/837,971.
U.S. Advisory Action, dated Mar. 16, 2020, for U.S. Appl. No. 15/837,971.
U.S. Final Office Action, dated Dec. 5, 2019, for U.S. Appl. No. 15/837,971.
U.S. Final Office Action, dated Jan. 8, 2019, for U.S. Appl. No. 15/837,971.
U.S. Final Office Action, dated Jun. 2, 2021, for U.S. Appl. No. 15/837,971.
U.S. Final Office Action, dated Nov. 19, 2020, for U.S. Appl. No. 15/837,971.
U.S. Non-Final Office Action, dated Jun. 15, 2018, for U.S. Appl. No. 15/837,971.
U.S. Non-Final Office Action, dated Jun. 15, 2020, for U.S. Appl. No. 15/837,971.
U.S. Non-Final Office Action, dated Jun. 26, 2019, for U.S. Appl. No. 15/837,971.
U.S. Non-Final Office Action, dated Mar. 1, 2021, for U.S. Appl. No. 15/837,971.
U.S. Advisory Action, dated Aug. 9, 2021, for U.S. Appl. No. 15/837,971.

(56) References Cited

OTHER PUBLICATIONS

U.S. Notice of Allowance for U.S. Appl. No. 15/837,971, dated Oct. 20, 2021.
European Patent Office Summons to attend oral proceedings pursuant to Rule 115(1) EPC issued in the corresponding European Patent Application No. 14773825.6 on Nov. 17, 2021.
Monberg et al., "The Growth of Low Dislocation Density p-inP Single Crystals." Journal of Electronic Materials, vol. 18, No. 4, Feb. 8, 1989, pp. 549-550.

\* cited by examiner

INDIUM PHOSPHIDE WAFER, PHOTOELECTRIC CONVERSION ELEMENT, AND METHOD FOR PRODUCING A MONOCRYSTALLINE INDIUM PHOSPHIDE

CROSS REFERENCE TO RELATED APPLICATIONS

This application is the National Phase of PCT/JP2014/056229 filed on Mar. 11, 2014, which claims priority under 35 U.S.C. 119(a) to Patent Application No. 2013-063145, filed in Japan on Mar. 26, 2013, all of which are hereby expressly incorporated by reference into the present application.

TECHNICAL FIELD

The present invention relates to an indium phosphide wafer made of a monocrystalline indium phosphide, a photoelectric conversion device including this indium phosphide wafer, and a method for producing the monocrystalline indium phosphide.

BACKGROUND ART

In recent years, compound semiconductors have attracted attention as materials for photoelectric conversion devices (cells) of solar batteries. The solar battery including a compound semiconductor has a wide variety of advantageous characteristics a silicon (Si)-based cell does not have. The most distinctive characteristic among them is its much higher conversion efficiency than Si.

The compound semiconductor has another remarkable advantage in that it can readily produce mixed crystals. Specifically, the compound semiconductor has an advantage in that its band-gap energy can be adjusted by changing the composition of a single crystal, and thus a material having a band gap required for a solar battery can be readily designed. Although a similar design can also be applied to Si-based single crystals to yield SiC or SiGe mixed crystals, the compound semiconductor can provide broader design selections.

Among the compound semiconductors used for photoelectric conversion devices, group III-V compound semiconductors, such as gallium arsenide (GaAs) and indium phosphide (InP) have higher resistance to radiation deterioration than that of silicon-based semiconductors, and thus are suitable for use in space.

A common GaAs or InP photoelectric conversion device includes a p-type semiconductor substrate made of a GaAs or InP single crystal containing zinc (Zn) as a dopant, a n-type thin layer made of a mixed crystal, such as indium gallium arsenide (GaInAs), epitaxially grown on the substrate, a surface electrode, and a rear electrode.

The GaAs or InP single crystal constituting the p-type semiconductor substrate is produced mainly by a liquid encapsulated Czochralski (LEC) method. Specifically, it is produced by pulling up a single crystal under a hydrostatic pressure on a melt by a liquid encapsulant in order to reduce the evaporation of elements having high dissociation pressure (see Patent document 1).

RELATED ART DOCUMENTS

Patent Documents

[Patent Document 1] Japanese Patent Application Laid-Open No. 9-165292

SUMMARY OF THE INVENTION

Problems to be Solved by the Invention

In the LEC method, the upper portion of a crucible for holding a raw material melt is filled with high-pressure inert gas and the temperature of the upper portion is lower than that of the melt; hence, a significant difference in temperature can occur between the upper and lower portions of the liquid encapsulant layer. Accordingly, dislocations readily occur in a single crystal that is pulled up and passes through the liquid encapsulant layer due to the thermal stress caused by a temperature gradient of the liquid encapsulant layer in direction of the pull rod (vertical direction).

In the LEC method, while the raw material melt is being maintained at a predetermined temperature with a heater surrounding the crucible, the seed crystal is pulled up toward a low temperature area in the upper portion of a furnace to grow a single crystal. During the growth of the single crystal, the central temperature of the single crystal is liable to be lowered by dissipation of the latent heat through the seed crystal whereas the peripheral temperature of the single crystal is liable to be increased compared to the center by the radiant heat from the heater. As a result, a temperature gradient can also be formed in the radial direction (horizontal direction) of the single crystal. Such a difference in temperature between the center and the periphery of the single crystal causes thermal stress, which will readily generate dislocation in the single crystal.

Furthermore, if a temperature gradient is formed in the horizontal direction, the interface between the growing single crystal and the melt (hereafter referred to as a "solid-liquid interface") tends to have a downward convex shape when seen from the horizontal direction. If the single crystal is grown from the solid-liquid interface having such a shape, the single crystal grows later at its periphery than at its center at the same height (the horizontal position of the single crystal). In addition, the concentration of the impurity in the melt increases as the growth of the single crystal proceeds due to impurity segregation. A cut surface of the single crystal in the horizontal direction therefore has a striation pattern of the concentration of the added impurity element concentrically increasing toward the periphery of the single crystal. When an epitaxial layer is grown on a single crystal wafer having such a striation pattern, a variation in distribution of the impurity element in the wafer may affect the electric characteristics of a device using this wafer as a substrate. Moreover, the impurity concentration may greatly vary among a plurality of rectangular device substrates cut out from such a wafer, resulting in a low production yield of devices with required quality.

A recent demand is to provide single crystals having larger size (volume) in order to increase the number of wafers obtainable from one single crystal, to increase the size of the device substrate that can be cut out from one wafer (i.e., to decrease the number of photoelectric conversion devices in one solar battery), and to decrease the manufacturing cost of photoelectric conversion devices and hence solar batteries. Thermal stress generated in the pulled-up single crystal however increases, as the diameter of a grown single crystal increases. As a result, increased dislocations readily occur in the single crystal. When a substrate sliced out from such a single crystal having more dislocations (a high dislocation density) is used to epitaxially grow a thin layer as an active layer of a device on the surface of the substrate, the dislocations in the substrate also propagates to the epitaxial layer (hereafter "epi-layer"), which may increase the dislocations in the epi-layer. Besides, such an increase in the dislocation density in a single crystal or a thin film leads to low conversion efficiency of photoelectric conversion devices made of such a single crystal.

For growing a single crystal such as InP having a low dislocation density in a conventional growing process, an impurity element having a impurity-hardening effect, in particular, zinc (Zn) or sulfur (S) is added to the single crystal at a high concentration ($3 \times 10^{18}$ cm$^{-3}$ or more), which allows the growth of an InP single crystal having a low dislocation density (500 cm$^{-2}$ or less). Unfortunately, the addition of a high level of Zn or S to the InP substrate readily causes thermal diffusion of Zn or S from the substrate to an epi-layer grown on the substrate. Since the impurity such as Zn or S thermally diffused to the epi-layer impairs the electrical properties of the epi-layer, the resulting photoelectric conversion device has a low conversion efficiency even though it has a low dislocation density.

An object of the present invention, which has been made to solve the above problems, is to provide a large-area substrate made of a monocrystalline indium phosphide containing Zn as an impurity, the substrate being used for production of photoelectric conversion devices having high conversion efficiency.

Means for Solving the Problems

The invention of claim 1 is an indium phosphide wafer including a monocrystalline indium phosphide containing zinc as an impurity, including: a main surface having a circular shape having a diameter of two inches or more, the single crystal having a mean zinc concentration of $5 \times 10^{17}$ cm$^{-3}$ or more and less than $1 \times 10^{18}$ cm$^{-3}$ and a mean dislocation density of 5000 cm$^{-2}$ or less.

The invention of claim 2 is the indium phosphide wafer according to claim 1, wherein a relative standard deviation of zinc concentrations determined at individual regions is 20% or less when the wafer is divided into several regions on a plane perpendicular to the main surface to measure the zinc concentration for each region and the relative standard deviation is determined as the ratio of standard deviation of the zinc concentrations to the mean value of the zinc concentrations.

The invention of claim 3 is the indium phosphide wafer according to claim 1, wherein a $C_H/C_L$ ratio of a zinc concentration "$C_H$" of a region closest to the periphery of the main surface relative to a zinc concentration "$C_L$" of a region including the central point of the main surface is 1.8 or less when the wafer is divided into several regions on a plane perpendicular to the main surface to measure the zinc concentration for each region.

"a region closest to the periphery of the main surface" includes a region away from the periphery and a region adjacent to the periphery.

The invention of claim 5 is a photoelectric conversion device including: a p-type semiconductor substrate cut out from the indium phosphide wafer according to any one of claims 1 to 4; an n-type semiconductor layer formed on a first main surface of the p-type semiconductor substrate; a first electrode formed on a surface of the n-type semiconductor layer; and a second electrode formed on a second main surface of the p-type semiconductor substrate.

The invention of claim 6 is a method for producing a monocrystalline indium phosphide containing zinc as an impurity, the method including: placing a raw material and an encapsulant in a heat-resistant pot; heating the raw material and the encapsulant to obtain a melt by melting the raw material and soften the encapsulant such that the encapsulant covers the melt from above; controlling the temperature in the pot such that the temperature of the upper portion of the encapsulant is as high as possible and below the temperature of the lower portion of the encapsulant; and dipping a seed crystal into the melt and pulling up the seed crystal above the melt to grow a single crystal from the seed crystal in a cylindrical shape having a diameter of two inches or more and having a mean zinc concentration of $5 \times 10^{17}$ cm$^{-3}$ or more and less than $1 \times 10^{18}$ cm$^{-3}$ and a mean dislocation density of 5000 cm$^{-2}$ or less.

"Controlling the temperature in the pot such that the temperature of the upper portion of the encapsulant is as high as possible and below the temperature of the lower portion of the encapsulant" includes heating the upper portion of the encapsulant strongly and suppression of escaping of heat near the upper portion of the encapsulant.

The invention of claim 7 is the method for producing a monocrystalline indium phosphide according to claim 6, wherein the seed crystal is pulled up while the seed crystal is being rotated at 5 rpm to 40 rpm about its rotation axis being a vertical straight line passing through the seed crystal, the pot for holding the melt is being rotated about its rotation axis being a vertical straight line passing through the seed crystal in the same direction as the seed crystal for growing the single crystal, and the rotational rates of the seed crystal and the pot are adjusted such that a "Rs/Rc" ratio of the rotational rate of the seed crystal "Rs" to the rotational rate of the pot "Rc" ranges from 1.10 to 1.33.

The invention of claim 8 is the method for producing a monocrystalline indium phosphide according to claim 7, wherein the rotational rate of the pot ranges from 5 rpm to 35 rpm.

The invention of claim 9 is the method for producing a monocrystalline indium phosphide according to claim 6, wherein the seed crystal is pulled up while a pot holding the melt is being rotated at 5 rpm to 35 rpm about its rotation axis being a vertical straight line passing through the melt held by the pot, and the seed crystal is being rotated about its rotation axis being a vertical straight line passing through the melt held by the pot in the same direction as the pot for growing the single crystal.

The invention of claim 10 is the method for producing a monocrystalline indium phosphide according to claim 9, wherein the rotational rate of the seed crystal ranges from 5 rpm to 40 rpm.

The invention of claim 12 is the method for producing a monocrystalline indium phosphide according to claim 6, wherein the pulling rate of the seed crystal ranges from 5 mm/h to 15 mm/h.

Advantageous Effects of the Invention

According to the present invention, a single-crystal can be grown without effect of thermal stress due to a small difference in temperature between the upper and lower portions of an encapsulant; hence, an indium phosphide wafer can be prepared having a larger diameter of two inches or more and a low dislocation density of 5000 cm$^{-2}$ even though it has a low mean Zn concentration in the range of $5\times10^{17}$ cm$^{-3}$ to $3\times10^{18}$ cm$^{-3}$ which precludes crystallization. A large-area substrate can therefore be cut out from such a wafer, and a thin layer can be epitaxially grown on the substrate to produce a device having less propagation of dislocations to the thin layer.

Thus, a large-area substrate made of a monocrystalline indium phosphide containing Zn as an impurity can be produced, the substrate being used for production of photoelectric conversion devices having high conversion efficiency and thus low-cost production of high-performance solar batteries.

EMBODIMENTS FOR CARRYING OUT THE INVENTION

Embodiments

Various embodiments of the present invention will now be described in detail with reference to the attached drawings.
[Configuration of Photoelectric Conversion Device]

Figure 1:
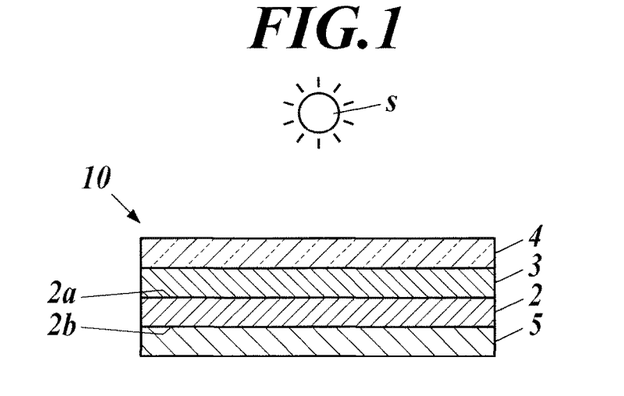
FIG. 1 is a longitudinal sectional view of a photoelectric conversion device according to an embodiment of the present invention.

An overview configuration of a photoelectric conversion device of the present embodiment will be described. FIG. 1 is a longitudinal sectional view of a photoelectric conversion device 10 of the present embodiment. In the substrate and each layer, the upper surface (adjacent Sun "s") is defined as a "front surface" and the lower surface as a "rear surface" in the drawing.

The photoelectric conversion device 10 of the present embodiment includes a p-type semiconductor substrate (hereafter "p-type substrate 2"), an n-type semiconductor layer (hereafter "n-type layer 3") formed on the front surface (first main surface) 2a of the p-type substrate 2, a front electrode 4 (first electrode) formed on the front surface of the n-type layer 3, a rear electrode 5 (second electrode) formed on the rear surface (second main surface) 2b of the p-type substrate 2.

The p-type substrate 2 is a rectangular plate having a diagonal length of two inches or more and is made of monocrystalline indium phosphide (hereafter "InP"), which is a group III-V compound semiconductor. The InP single crystal used here has a mean dislocation density of 5000 cm$^{-2}$ or less. This InP single crystal contains zinc (hereafter "Zn") as a dopant (impurity) in a mean concentration in the range of $5\times10^{17}$ cm$^{-3}$ to $3\times10^{18}$ cm$^{-3}$. The p-type substrate 2 has a small variation in Zn concentration distribution in the main surface direction. For example, if the substrate is divided into several regions (each region preferably has the same shape and the same area as in cutting out the substrate) on a plane perpendicular to the main surfaces to measure the Zn concentration for each region, a relative standard deviation (coefficient of variation) of the Zn concentration determined at individual regions will be 20% or less.

The n-type layer 3 is formed by epitaxial growth of, for example, indium gallium arsenide (hereafter "InGaAs"), which is a mixed crystal of gallium arsenide (GaAs) and indium arsenide (InAs) into a thin film.

The front electrode 4 is formed into a thin film made of, for example, a transparent conductive material, such as indium tin oxide (ITO).

The rear electrode 5 is, for example, a graphite plate.
[Methods for Producing Compound Semiconductor Crystal and Compound Semiconductor Wafer]

A methods for producing an InP single crystal as a group III-V compound semiconductor single crystal of the present embodiment and an InP wafer 1 as a compound semiconductor wafer of the present embodiment will be described. The method for producing the InP single crystal involves a preparation step, a heating step, and a crystal growing step, and the method for producing the InP wafer 1 involves a cutting step, a lapping step, and a mirror polishing step.

In the initial preparation step, a cylindrical crucible made of pyrolytic boron nitride (pBN) (hereafter "crucible"), which is a heat-resistant pot, is filled with polycrystalline InP containing Zn (hereafter "Zn-doped polycrystalline InP") and polycrystalline InP not containing any impurity (undoped polycrystalline InP) as raw materials of the InP single crystal, each weighed such that the Zn level in a melt is within the predetermined range. Diboron trioxide ($B_2O_3$) as an encapsulant is then placed on the raw materials in the crucible. The crucible containing the raw materials and the encapsulant is placed in a single crystal growing furnace. In the present embodiment, a single crystal is grown by the LEC method using a LEC furnace as a single crystal growing furnace.

The LEC furnace (not shown) has a hermetic structure that can hold high-temperature and high-pressure inert gas, and includes, in its inside, a mounting stage for mounting the crucible and a pull rod that extends in the vertical direction over the mounting stage.

The mounting stage can rotate the crucible placed thereon about its rotation axis, which is a vertical straight line passing through the center of the stage.

The pull rod, to which a seed crystal can be provided at its lower end, is movable in its vertical direction and rotatable about its rotation axis, which a vertical straight line (which is aligned with the rotation axis of the crucible) passing through the center of the seed crystal.

The rotational rate of the mounting stage, the rotational rate of the pull rod, and the moving rate of the pull rod in the upper direction (pulling rate of the single crystal) each can be appropriately set.

After the crucible is placed in the LEC furnace, the process proceeds to the heating step. In this step, the inside of the furnace is pressurized with an inert gas into a predetermined pressure, and a heater in the LEC furnace is energized to increase the temperature in the furnace. When the temperature in the furnace reaches the predetermined temperature, the encapsulant softens into a layer having a thickness of about 20 mm which then covers the raw materials from above. When the temperature in the furnace further increases, the raw materials melt, and Zn contained in the Zn-doped polycrystalline InP diffuses throughout the melt. After that, the furnace is cooled. When the interface temperature between the stabilized melt and the encapsulant reaches 1062° C. (the growth temperature of InP), the temperature is kept constant to stabilize the melt. Note that the temperature in the crucible during the cooling process of the furnace is controlled such that the temperature of the upper portion of the encapsulant is as high as possible and below the temperature of the lower portion thereof, that is, the difference in temperature between the upper and lower portions (temperature gradient in the vertical direction) is small. Specifically, the temperature gradient is kept at about 85 to 130° C./cm by covering the upper portion of the crucible with a heat shielding plate (a lid having a hole through which the seed crystal portion can pass) to prevent the heat radiation from the melt, or by disposing an auxiliary heater over the crucible to heat the inert gas. Such a measure can mitigate the effect of the thermal stress on a single crystal in the pull rod direction during the pull-up of the grown single crystal through the liquid encapsulant layer.

After the melt has been stabilized, the process proceeds to the crystal growing step. In this step, the pull rod provided with a seed crystal at its lower end is brought down. The seed crystal passes through the encapsulant layer to be dipped into the melt. After that, the seed crystal is pulled up in the vertical direction at a rate of 5 to 15 mm/h while the pull rod is being rotated at 5 to 40 rpm and the crucible is being rotated at 5 to 35 rpm in the same direction as the seed crystal. An InP single crystal begins to grow laterally and downwardly from the seed crystal. This InP single crystal is grown in the vertical direction into an InP single crystal ingot (hereafter "ingot") with a predetermined length.

In this process, the reason why the rotation direction of the pull rod should be the same as that of the crucible, and why the rotational rate of the pull rod, the rotational rate of the crucible, and the pulling rate of the pull rod are set to be the above-described range for growing the single crystal will be described. The growth of a single crystal proceeds at the interface between the growing single crystal and the raw material melt (hereafter "solid-liquid interface"). Since most of the solidification latent heat, which is generated during the growth of the single crystal, usually dissipates from the seed crystal through the pull rod, the central temperature of the solid-liquid interface readily decreases. By contrast, the peripheral temperature of the solid-liquid interface readily increases by the radiant heat from the heater disposed around the crucible toward the side of the crucible. Since the single crystal readily solidifies at the center of the solid-liquid interface, the solid-liquid interface tends to have a downward convex shape. In other words, the growth history of the single crystal grown from such a solid-liquid interface in the growth direction (vertical direction) and the direction perpendicular thereto (horizontal direction) will show that the single crystal grows earlier at the center or later at the periphery.

As the single crystal grows, the impurity concentration in the melt increases due to segregation of the impurity. Specifically, since the single crystal grown from the solid-liquid interface having a downward convex shape as described above has an impurity concentration increasing from its center to its periphery, a cut surface of the single crystal in the direction perpendicular to its growth direction has a concentration pattern in which the Zn concentration concentrically varies (also referred to as "striation pattern of impurity") (when an impurity element has a segregation factor of less than 1, the concentration increases from the center to the periphery of a wafer).

The inventor has found that the pulling rate of the pull rod, the rotation rate of the pull rod, the rotation direction of the crucible, and the shape of the solid-liquid interface are correlated to each other. Specifically, when the pull rod is rotated to the same direction as the crucible, the solid-liquid interface tends to have a flat shape, whereas when it is rotated to the opposite direction, the solid-liquid interface tends to have a downward convex shape, not a flat shape. For example, during the rotation of the pull rod to the right (clockwise), if the crucible is rotated clockwise, the solid-liquid interface can have a flat shape. By contrast, if the crucible is rotated to the left (counterclockwise), the solid-liquid interface tends to have a downward convex shape. The inventor has further found that if the rotation rate and the pulling rate are set within the above-described range, the solid-liquid interface can have a remarkably flat shape.

The detailed mechanism for this phenomenon has not been explained yet, but plausible explanations are as follows: First, optimization of the combination of rotational rates of the pull rod (seed crystal) and crucible facilitates stirring of the melt to transfer of the heat from the periphery of the solid-liquid interface to the center of the solid-liquid interface. Second, optimization of the pulling rate of the pull rod ensures balance between the quantity of the heat dissipating through the pull rod and the quantity of the heat dissipating from the side of the single crystal into the inert gas.

In addition, the temperature gradient in the radial direction of the single crystal is gentle; hence, the dislocation density of the single crystal is reduced, and the growth of the single crystal in the direction horizontal to the single crystal occurs at the same time. As a result, the Zn concentration distribution in the horizontal direction of the grown single crystal can be nearly uniform.

After the ingot production, the process proceeds to the cutting step. In this step, the both upper and lower ends of the ingot are cut off and the surface of the remaining middle portion (straight body portion) is shaved to trim the ingot into a cylindrical shape having a diameter of two inches or more. The ingot is then cut perpendicular to the single crystal growth direction (parallel to the circular surfaces at the both ends of the ingot) to slice out a plurality of discoidal wafers. As described above, since the Zn concentration distribution in the direction along a plane perpendicular to the growth direction is nearly uniform in the ingot of the present embodiment, the in-plane variation in Zn concentration in each wafer is small.

After the wafer is sliced out, the process proceeds to the lapping step. In this step, the cutting section of the wafer is ground with a lapping abrasive to eliminate asperities.

After the cutting section is planarized, the process proceeds to the mirror polishing step. In this step, the lapped surface of the wafer is polished with a mirror polishing abrasive to prepare a mirror finished surface.

The InP wafer 1 of the present embodiment produced through the steps described above is characterized in that the main surface has a circular shape having a diameter of two inches or more, the mean Zn concentration in the single crystal ranges from $5 \times 10^{17}$ cm$^{-3}$ to $3 \times 10^{18}$ cm$^{-3}$, the mean dislocation density is 5000 cm$^{-2}$ or less, and the relative standard deviation of the Zn concentration at individual regions is 20% or less when the wafer is divided into several regions on a plane perpendicular to the main surfaces to measure the Zn concentration for each region.

[Method for Producing Photoelectric Conversion Device]

A method for producing the photoelectric conversion device 10 of the present embodiment with an InP wafer 1 as a substrate 2 will be described. The method for producing the photoelectric conversion device 10 involves the steps of forming an n-type layer, forming a front electrode, forming a rear electrode, and dicing the wafer.

In the initial step of forming an n-type layer, the InP wafer 1 and raw materials, In, Ga, and As, for the n-type layer 3 are placed in a vapor phase epitaxy system. An InGaAs thin film is then epitaxially grown on the surface of the InP wafer 1. Since the InP wafer 1 of the present embodiment has a low dislocation density, a limited number of dislocations propagates to the grown InGaAs thin film. Since the InP wafer 1 of the present embodiment also has a small variation in Zn concentration, that is, has no portion (in particular, no peripheral portion) having an extremely high Zn concentration, Zn contained in the InP wafer 1 barely diffuses into the grown InGaAs thin film on the surface of the InP wafer 1. This thin film is grown into an n-type layer 3 with a predetermined thickness.

After the n-type layer 3 is formed, the process proceeds to the step of forming a front electrode. In this step, the front electrode 4 of a thin ITO film is formed on the surface of the n-type layer 3. The electrode may be formed by any conventional method, including physical vapor deposition (PVD), such as sputtering, film deposition, ion-assisted vacuum deposition; and other deposition, such as chemical vapor deposition (CVD), coating, spin-coating, and spraying.

After the front electrode 4 is formed, the process proceeds to the step of forming a rear electrode. In this step, the rear electrode 5 of a graphite thin film is formed on the surface of the InP wafer 1. The electrode may be formed by any conventional method including coating and vapor deposition.

After the rear electrode 5 is formed, the process proceeds to the dicing step. In this step, the ends of the InP wafer 1 provided with the n-type layer 3, the front electrode 4, and the rear electrode 5 on main surfaces 1a or 1b is trimmed into one photoelectric conversion device 10, or the InP wafer 1 is divided into a plurality of substrates 1, 1 . . . to cut out a plurality of photoelectric conversion devices 10.

The photoelectric conversion device 10 of the present embodiment is produced through the steps described above. Since the photoelectric conversion device 10 includes a substrate cut out from the InP wafer 1 having circular main surfaces having a diameter of two inches or more and a mean dislocation density of 5000 $cm^{-2}$ or less, it has a high conversion efficiency compared to conventional devices. In addition, since the photoelectric conversion device 10 includes the InP wafer 1 as the substrate 2 having a relative standard deviation of the Zn concentration determined at individual regions of 20% or less when the wafer is divided into several regions on a plane perpendicular to the main surfaces to measure the Zn concentration for each region, it has reduced thermal diffusion of Zn to the n-type layer 3, resulting in superior electric characteristics compared to conventional devices.

EXAMPLES

Figure 2:
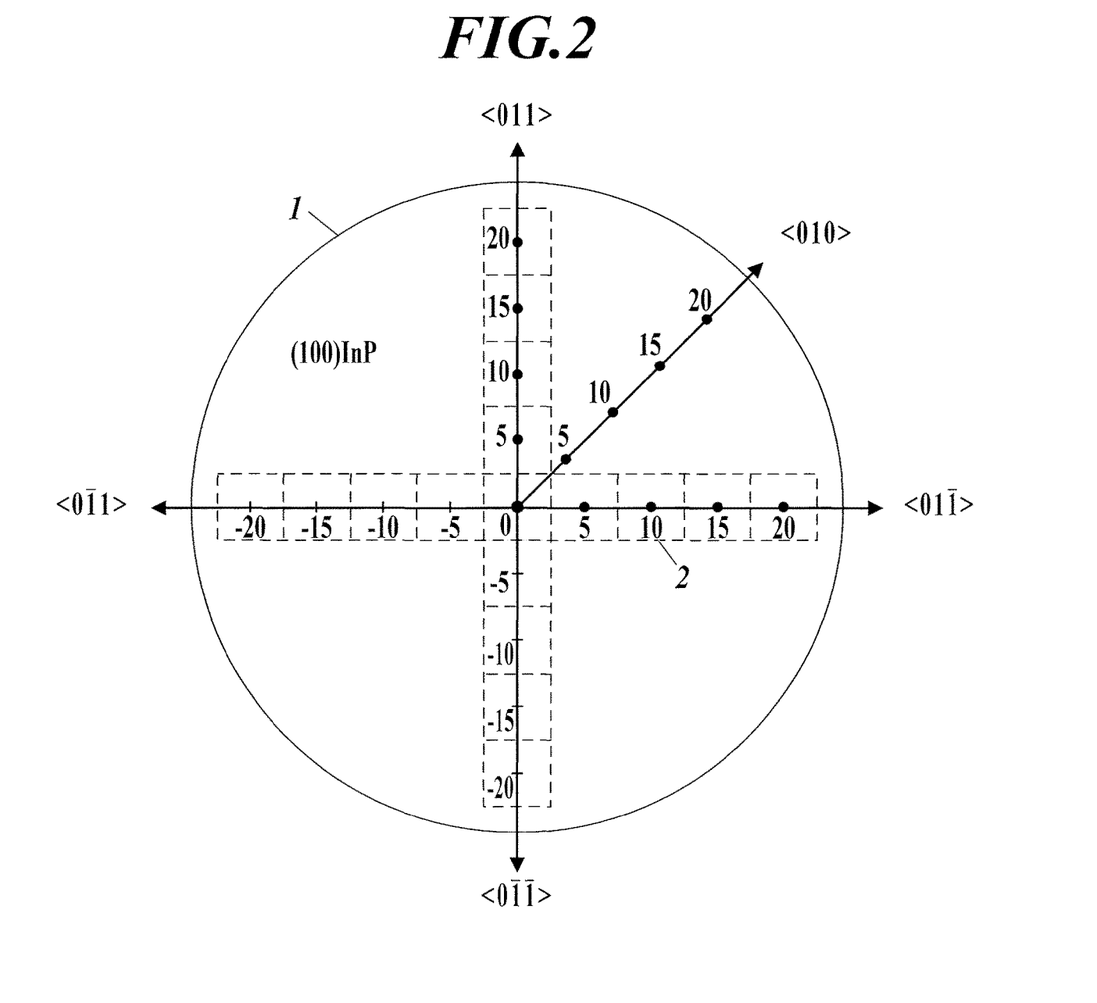
FIG. 2 illustrates one exemplary method for measuring the dislocation density and zinc concentration in a compound semiconductor wafer.

The dislocation density and Zn concentration in the InP wafer 1 of the present embodiment will now be described with reference to the following examples. FIG. 2 illustrates the InP wafer 1 of the present embodiment with a (100) plane (main surface) facing the front of the drawing.

For illustration, three ingots of the InP single crystal (Examples 1 to 3) were actually produced by the production method according to the present embodiment. The specific production conditions for the individual ingots will be described below. After cylindrical milling of each produced ingot, the InP wafers 1 having a thickness of 3 mm were sliced out from the upper, middle, and lower portions of the ingot, rinsed, degreased, subjected to mirror surface etching with a solution of 3% bromine in methanol, and then etched with a solution of phosphoric acid and hydrogen peroxide (Huber etching) to reveal the etch-pit.

The InP wafers 1 sliced out from the upper, middle, and lower portions of each ingot were used to measure the dislocation density of the individual InP wafers 1. Specifically, a Nomarski microscope is used to measure dislocation densities at total 13 points, i.e., the central point and the points 5, 10, 15, 20 mm away from the central point toward the three directions <01-1>, <011>, and <010> (filled circles in FIG. 2, four points for each direction), in the (100) plane of the InP wafer 1 shown in FIG. 2, and the dislocation densities at individual measurement points were averaged (area weighted) to give the mean dislocation density.

Several p-type substrates 2, each having 5 mm×5 mm square main surfaces with a thickness of 3 mm, were cut out from each InP wafer 1 described above. Specifically, as shown by the dashed lines in FIG. 2, they were cut out such that the central point and the points 5, 10, 15, 20 mm away from the central point toward four directions <01-1>, <01-1>, <011>, and <0-1-1> (four points for each direction; total 17 points) in the (100) plane were aligned with the center of the individual p-type substrates 2. The Zn concentration in each p-type substrate 2 was then determined with an inductively-coupled plasma mass spectrometer (ICP-MS). The Zn concentration in the p-type substrate 2 cut out from the center of the InP wafer 1 was defined as the representative value of the Zn concentration for each of the upper, middle, and lower portions of the ingot (local Zn concentration). The relative standard deviation of the Zn concentration was also determined from the Zn concentrations determined at the individual p-type substrates 2 for each InP wafer 1. For each InP wafer 1, the ratio of the highest value "$C_H$" among the Zn concentrations of four p-type substrates 2 cut out from the periphery (the portions closest to the periphery of the main surface) to the local Zn concentration "$C_L$" (the Zn concentration of the p-type substrate 2 cut out from the portion closest to the central point of the main surface) (hereafter, "Zn concentration ratio $C_H/C_L$") was also determined. Typically, the impurity level in a wafer is lowest in its center and gradually increases toward its periphery. Therefore, "$C_L$" is the smallest value and "$C_H$" is the highest value among the several Zn concentrations determined as described above.

The reason why the Zn concentration in the substrate 2 cut out from the center of the InP wafer 1 was defined as the representative value of the local Zn concentrations will be described. As described above, the difference in Zn concentration between the center and the periphery of the wafer that is horizontally cut out (the Zn concentration is low at the center and high at the periphery) decreases as the flatness of the solid-liquid interface increases, whereas the difference increases as the downward convexity of the solid-liquid interface increases. The results indicate that the Zn concentration in a single crystal depends on the time when the single crystal solidifies. Specifically, the Zn concentration in the melt increases as the growth of the single crystal proceeds, and the single crystal at the periphery solidifies later compared to the center at the same height (on a horizontal plane) as the downward convexity of the solid-liquid interface increases. In other words, the difference in Zn concentration between the center and the periphery of the wafer greatly depends on the growth condition (the shape of the solid-liquid interface). Specifically, a solid-liquid interface having a remarkably downward convex shape results in a large difference in Zn concentration between the center and the periphery of the wafer (in-plane distribution). By contrast, a solid-liquid interface having a flat shape leads to a small difference in Zn concentration between the center and the periphery of the wafer (in-plane distribution), achieving production of an InP wafer having a uniform Zn concentration in a wafer plane.

The production conditions, the measured mean dislocation densities, the local Zn concentrations, and the calculated relative standard deviations of the Zn concentrations for the individual ingots are shown in Table 1, and the Zn concentrations "C" of the individual chips sliced out from the ingot according to Example 1 and the Zn concentration ratios "$C_H/C_L$" are shown in Table 2.

having an inner diameter of 100 mm. An encapsulant (200 g) was then added thereto and the mixture were melted while pressure in the furnace was being maintained at 5 MPa. An InP single crystal having a diameter of 55 mm was grown at a pulling rate of the pull rod of 10 mm/h, a rotational rate of

TABLE 1

| | GROWTH CONDITION | | | | | |
|---|---|---|---|---|---|---|
| | ROTATION NUMBER OF PULL ROD Rs[rpm] | ROTATION NUMBER OF CRUCIBLE Rc[rpm] | Rs/Rc | PORTION OF WAFER (SOLIDIFICATION RATE) | Zn CONCENTRATION IN SINGLE CRYSTAL[%] | MEAN DISLOCATION DENSITY [cm$^{-2}$] | RELATIVE STANDARD DEVIATION OF Zn CONCENTRATION |
| EXAMPLE 1 | 20 | 15 | 1.33 | UPPER PORTION(0.27) | $1.08 \times 10^{18}$ | 1000 | 17.4 |
| | | | | MIDDLE PORTION(0.55) | $1.25 \times 10^{18}$ | >500 | 16.1 |
| | | | | LOWER PORTION(0.82) | $1.96 \times 10^{18}$ | >500 | 10.4 |
| EXAMPLE 2 | 23 | 21 | 1.10 | UPPER PORTION(0.26) | $5.06 \times 10^{17}$ | 4800 | 19.6 |
| | | | | MIDDLE PORTION(0.55) | $5.87 \times 10^{17}$ | 3700 | 17.8 |
| | | | | LOWER PORTION(0.88) | $9.22 \times 10^{17}$ | 1000 | 11.8 |
| EXAMPLE 3 | 24 | 19 | 1.26 | UPPER PORTION(0.25) | $2.06 \times 10^{18}$ | >500 | 16.4 |
| | | | | MIDDLE PORTION(0.55) | $2.40 \times 10^{18}$ | >500 | 15.3 |
| | | | | LOWER PORTION(0.85) | $3.77 \times 10^{18}$ | >500 | 9.4 |

TABLE 2

| | | Zn CONCENTRATION FOR INDIVIDUAL CHIPS[cm$^{-3}$] | | |
|---|---|---|---|---|
| | | UPPER PORTION | MIDDLE PORTION | LOWER PORTION |
| CENTER OF WAFER(−2.5~2.5) (MEAN LOCAL Zn CONCENTRATION $C_L$) | | 1.08E+18 | 1.25E+18 | 1.96E+18 |
| DIRECTION TOWARD <01-1> | 17.5~22.5 | 1.94E+18 | 2.15E+18 | 2.72E+18 |
| | 12.5~17.5 | 1.73E+18 | 1.95E+18 | 2.63E+18 |
| | 7.5~12.5 | 1.50E+18 | 1.75E+18 | 2.43E+18 |
| | 2.5~7.5 | 1.21E+18 | 1.45E+18 | 2.13E+18 |
| DIRECTION TOWARD <01-11> | −2.5-7.5 | 1.28E+18 | 1.45E+18 | 2.13E+18 |
| | −7.5~−12.5 | 1.49E+18 | 1.75E+18 | 2.43E+18 |
| | −12.5~−17.5 | 1.76E+18 | 1.95E+18 | 2.63E+18 |
| | −17.5~−22.5 | 1.93E+18 | 2.15E+18 | 2.73E+18 |
| DIRECTION TOWARD <011> | 17.5~22.5 | 1.96E+18 | 2.15E+18 | 2.74E+18 |
| | 12.5~17.5 | 1.73E+18 | 1.95E+18 | 2.63E+18 |
| | 7.5~12.5 | 1.53E+18 | 1.73E+18 | 2.43E+18 |
| | 2.5~7.5 | 1.29E+18 | 1.43E+18 | 2.13E+18 |
| DIRECTION TOWARD <0-1-1> | −2.5-7.5 | 1.28E+18 | 1.42E+18 | 2.13E+18 |
| | −7.5~−12.5 | 1.52E+18 | 1.74E+18 | 2.43E+18 |
| | −12.5~−17.5 | 1.77E+18 | 1.95E+18 | 2.63E+18 |
| | −17.5~−22.5 | 1.91E+18 | 2.15E+18 | 2.74E+18 |
| MEAN VALUE | | 1.58E+18 | 1.79E+18 | 2.45E+18 |
| STANDARD DEVIATION (SAMPLED FROM POPULATION) | | 2.76E+17 | 2.89E+17 | 2.54E+17 |
| RELATIVE STANDARD DEVIATION | | 17.40% | 16.17% | 10.38% |
| CONCENTRATION RATIO$C_H/C_L$ | | 1.81 | 1.72 | 1.39 |

Example 1

In Example 1, 1500 g of raw material composed of polycrystalline InP containing Zn and polycrystalline InP intentionally containing no impurity was prepared such that the Zn concentration was $1.4 \times 10^{18}$ cm$^{-3}$ after the polycrystalline InP raw material melted, and was placed in a crucible the pull rod "Rs" of 20 rpm (clockwise), and a rotational rate of the crucible "Rc" of 15 rpm (clockwise) (Rs/Rc=1.33).

As shown in Table 1, the mean dislocation density of the InP wafer 1 from the upper portion of the InP single crystal ingot according to Example 1 (solidification rate: about 0.27) was 1000 cm$^{-2}$. The mean dislocation densities of the InP wafers 1 from the middle portion of the ingot (solidification rate: 0.55) and the lower portion thereof (solidification rate: 0.82) were both less than 500 cm$^{-2}$.

The Zn concentrations of the p-type substrates 2 cut out from the center of the individual InP wafers 1, i.e., the local Zn concentrations in the upper, middle, and lower portions of the ingot were $1.08 \times 10^{18}$ cm$^{-3}$, $1.25 \times 10^{18}$ cm$^{-3}$, and $1.96 \times 10^{18}$ cm$^{-3}$ respectively of low concentrations. This shows that the InP single crystal according to Example 1 has a low dislocation density even at a lower Zn concentration than that of a conventional single crystal.

The relative standard deviation of the Zn concentration in the InP wafer 1 sliced out from the upper portion of the ingot according to Example 1 was 17.40%. Those of the InP wafers 1 sliced out from the middle and lower portions were 16.17% and 10.38% respectively, both of which were below 18%. This shows that the InP wafer 1 according to Example 1 has a small variation in Zn concentration in the main surface.

For the InP wafer 1 sliced out from the upper portion of the ingot, among the four p-type substrates 2 cut out from the periphery toward four directions <01-1>, <0-11>, <011>, and <0-1-1>, the substrate cut out from the points 17.5 to 22.5 toward the <011> direction had the highest Zn concentration "$C_H$" of 1.96E+18. For the wafer sliced out from the middle portion, all of the four p-type substrates 2 sliced out similarly to the upper portion have the highest concentration "$C_H$" of 2.15E+18. For the wafer sliced out from the lower portion, the two substrates 2 sliced out at the points 17.5 to 22.5 toward the <011> direction and the points −22.5 to −17.5 toward the <0-1-1> direction have the highest concentration "$C_H$" of 2.74E+18 among the four p-type substrates 2 sliced out similarly to the upper and middle portions. The Zn concentration ratios "$C_H/C_L$" calculated for the individual InP wafers 1 were 1.81, 1.72, and 1.39 respectively. The results show that the difference in Zn concentrations between the center and the periphery of the InP wafer 1 is small.

Example 2

In Example 2, an InP single crystal 1 having a lower Zn concentration than that of Example 1 was grown. Specifically, a raw material composed of polycrystalline InP containing Zn and an polycrystalline InP intentionally containing no impurity was prepared such that the Zn concentration in the InP melt was $6.6 \times 10^{17}$ cm$^{-3}$ and placed in a crucible. The rotational rates of the seed crystal "Rs" and the crucible "Rc" were set to be 23 rpm and 21 rpm respectively ("Rs/Rc"=1.10) for growing the single crystal. The other growth conditions are similar to those in Example 1.

As shown in Table 1, the mean dislocation densities of the InP wafers 1 from the upper (solidification rate: about 0.26), middle (solidification rate: 0.55), and lower (solidification rate: 0.88) portions of the InP single crystal ingot according to Example 2 were 4800 cm$^{-2}$, 3700 cm$^{-2}$, and 1000 cm$^{-2}$ respectively, which were slightly higher than those in Example 1, but all were below 5000 cm$^{-2}$. The local Zn concentrations in the upper, middle, and lower portions of the ingot were $5.06 \times 10^{17}$ cm$^{-3}$, $5.87 \times 10^{17}$ cm$^{-3}$, and $9.22 \times 10^{17}$ cm$^{-3}$ respectively, which were about one digit lower than a conventional Zn-doped InP single crystal. The results show that the InP single crystal according to Example 2 has a sufficiently low dislocation density although it has a low impurity hardening effect due to its low Zn concentration.

The relative standard deviations of the Zn concentrations in individual InP wafers 1 sliced out from the upper, middle, and lower portions of the ingot according to Example 2 were 19.6%, 17.8%, and 11.8% respectively, all of which were below 20%. This shows that the variation in Zn concentration distribution along the main surface in the InP wafer 1 was larger than that in Example 1, but was sufficiently small compared to that in a conventional wafer.

Example 3

In Example 3, an InP single crystal having a higher Zn concentration than that of Example 1 but lower than that of conventional crystals was grown. Specifically, a raw material composed of polycrystalline InP containing Zn and polycrystalline InP intentionally containing no impurity was prepared such that the Zn concentration in the InP melt was $2.7 \times 10^{18}$ cm$^{-3}$ and placed in a crucible. This single crystal was grown at the rotational rates of the pull rod "Rs" and the crucible "Rc" of 24 rpm and 19 rpm respectively (Rs/Rc=1.26). The other growth conditions are the same as those in Examples 1 and 2.

As shown in Table 1, the mean dislocation densities of the InP wafers 1 from the upper (solidification rate: 0.25), middle (solidification rate: 0.55), and lower (solidification rate: 0.85) portions of the Zn-doped InP single crystal ingot according to Example 3 were all below 500 cm$^{-2}$ (indicating no dislocation). The local Zn concentrations in the upper, middle, and lower portions of the ingot were $2.06 \times 10^{18}$ cm$^{-3}$, $2.40 \times 10^{18}$ cm$^{-3}$, and $3.77 \times 10^{18}$ cm$^{-3}$ respectively. The results demonstrate that the InP single crystal according to Example 3 has a low dislocation density although it has a low Zn concentration compared to a conventional wafer.

The relative standard deviations of the Zn concentration in individual InP wafers 1 sliced out from the upper, middle, and lower portions of the ingot according to Example 3 were 16.4%, 15.3%, and 9.4% respectively, all of which were below 17%. This shows that the variation in Zn concentration distribution along the main surface in the InP wafer 1 is significantly small compared to those in Examples 1 and 2.

Other Examples

In Examples 1 to 3, the pull rod and the crucible were rotated clockwise (to the right) to grow an InP single crystal, whereas in the other Examples, the pull rod and the crucible were rotated counterclockwise (the other growth conditions are the same as those in Examples 1 to 3) to grow an InP single crystal. Wafers were sliced out from this single crystal to measure their dislocation densities and Zn concentrations. The results were similar to those in Examples 1 to 3.

As described above, the temperature of the crucible in the present embodiment is controlled such that the temperature of the upper portion of the encapsulant is as high as possible and below the temperature of the lower portion thereof to grow an InP single crystal. In this way, the InP single crystal can be grown without effect of thermal stress due to a small difference in temperature between the upper and lower portions of the encapsulant; hence the InP wafer 1 can be prepared having a large diameter of two inches or more and a low dislocation density of 5000 cm$^{-2}$ even though it has a mean Zn concentration in the range of $5 \times 10^{17}$ cm$^{-3}$ to $3 \times 10^{18}$ cm$^{-3}$ that is too low to provide a crystal hardening effect. A large-area p-type substrate 2 can therefore be cut out from such a InP wafer 1, and an n-type layer 3 can be epitaxially grown on the p-type substrate 2 to produce a photoelectric conversion device 1 having less propagation of dislocation and diffusion of Zn to the n-type layer 3.

Thus, the large-area p-type substrate 2 made of an InP single crystal containing Zn as an impurity can be produced, the substrate being used for production of a photoelectric conversion device 10 having high conversion efficiency and thus low-cost production of high-performance solar batteries.

In the present embodiment, a seed crystal is pulled up while it is being rotated at 5 to 40 rpm about its rotation axis, which is a vertical straight line passing through the seed crystal, and a crucible for holding a melt is being rotated at 5 to 35 rpm about its rotation axis, which is a vertical straight line passing through the seed crystal, in the same direction as the seed crystal.

In the LEC furnace including a plurality of cylindrical heaters disposed so as to surround the periphery of a crucible, the radiant heat from the heaters transfers mainly to the sidewall of the crucible. Consequently, the periphery of a single crystal has a high temperature compared to its center, and dislocations readily occur in the single crystal due to the difference in temperature. However, according to the present embodiment, the difference in temperature is small between the center and the periphery of the single crystal, resulting in reduced thermal stress on the single crystal and further reduced dislocations.

The difference in temperature between the center and the periphery of the single crystal also readily causes the solid-liquid interface between the single crystal and the melt to have a downward convex shape. If the solid-liquid interface has such a shape, a single crystal is grown outwardly from the center of the solid-liquid interface along there, resulting in striation in the grown single crystal. However, according to the present embodiment, a small horizontal temperature gradient of the solid-liquid interface and thus a flat solid-liquid interface facilitates preparation of compound semiconductor wafers having a low relative standard deviation of the Zn concentration of 20% or less determined at several arbitrary portions. A photoelectric conversion device produced from the wafer with such a small variation in Zn concentration distribution can have further improved conversion efficiency.

Although the invention made by the present inventor has been specifically described based on the embodiments, the present invention should not be limited to the above-described embodiments, and can be modified without departing from the spirit of the present invention.

For example, in the present embodiment, InP is described as a typical example of group III-V compound semiconductors. The present invention can also be applied to general compound semiconductors, such as GaAs and gallium phosphide (GaP), that have been conventionally produced by methods utilizing a crystal hardening effect of Zn for reducing dislocations generated during pull up of crystals.

In the present embodiment, a raw material composed of Zn-doped polycrystalline InP and undoped polycrystalline InP is used, but a raw material composed of several Zn-doped polycrystalline InP components having different concentrations, or a raw material composed of monocrystalline InP and Zn-doped polycrystalline InP which has low quality unsuitable for commercial use may be employed.

ITO is used for the front electrode, but any other transparent and conductive material may be employed. Furthermore, graphite is used for the rear electrode, but a metal or any other conductive material may be employed.

The embodiments disclosed herein are all for illustration only in all respects and not intended to be limiting. The scope of the present invention is defined not by the above description but by the appended claims, and all modifications are intended to be included without departing from the meaning and scope equivalent to the claims.

INDUSTRIAL APPLICABILITY

The present invention can be utilized for cells of solar batteries, for example.

Explanation of Reference Numerals

10: photoelectric conversion device
1: InP wafer (compound semiconductor wafer)
2: p-type semiconductor substrate
3: n-type semiconductor layer
4: front electrode (first electrode)
5: rear electrode (second electrode)

The invention claimed is:

1. An indium phosphide wafer formed of a monocrystalline indium phosphide containing zinc as an impurity, comprising:
    a main surface of (100 plane) having a circular shape having a diameter of two inches or more; and
    a mean zinc concentration of $1.08 \times 10^{18}$ cm$^{-3}$ or less and a mean dislocation density of 1000 cm$^{-2}$ or less, wherein
    a relative standard deviation of zinc concentrations determined at individual regions is 20% or less in a total of 17 regions, each region having a 5 mm×5 mm square shape on the main surface, and
    the 17 regions are defined such that a central point is located in a center of the (100) plane and points 5, 10, 15, and 20 mm away from the central point are arranged in four directions <01-1>, <0-11>, <011>, and <0-1-1>, wherein there are four points for each direction that are aligned with the centers of the 5 mm×5 mm square shapes of the 17 regions, respectively, wherein each of the four directions extends from the central point such that i) the directions <01-1> and <0-11> extend from the central point in an opposite direction from each other, ii) the directions <011> and <0-1-1> extend from the central point in an opposite direction from each other, and iii) each angle between two adjacent directions of the four directions is 60° C.

2. The indium phosphide wafer according to claim 1, wherein a $C_H/C_L$ ratio of a zinc concentration "$C_H$" of a region closest to the periphery of the main surface relative to a zinc concentration "$C_L$," of a region including the central point of the main surface is 1.8 or less when the wafer is cut out into the 17 regions.

3. The indium phosphide wafer according to claim 1, wherein the mean zinc concentration is $9.22 \times 10^{17}$ cm$^{-3}$ or more and $1.08 \times 10^{18}$ cm$^{-3}$ or less.

4. The indium phosphide wafer according to claim 1, wherein the relative standard deviation of zinc concentrations is 17.8% or less.

5. The indium phosphide wafer according to claim 1, wherein the relative standard deviation of zinc concentrations is 11,8% or less.

6. A photoelectric conversion device comprising:
    a p-type semiconductor substrate cut out from the indium phosphide wafer according to claim 1;
    an n-type semiconductor layer formed on a first main surface of the p-type semiconductor substrate;
    a first electrode formed on a surface of the n-type semiconductor layer; and
    a second electrode formed on a second main surface of the p-type semiconductor substrate.

\* \* \* \* \*

UNITED STATES PATENT AND TRADEMARK OFFICE
CERTIFICATE OF CORRECTION

| | | |
|---|---|---|
| PATENT NO. | : 11,349,037 B2 | |
| APPLICATION NO. | : 14/780333 | |
| DATED | : May 31, 2022 | |
| INVENTOR(S) | : Akira Noda et al. | |

It is certified that error appears in the above-identified patent and that said Letters Patent is hereby corrected as shown below:

In the Claims

Column 16, Line 27, Claim 1:
Change:
"adjacent directions of the four directions is 60° C."
To:
-- adjacent directions of the four directions is 90°. --

Signed and Sealed this
Twenty-fifth Day of October, 2022

Katherine Kelly Vidal
*Director of the United States Patent and Trademark Office*